(12) United States Patent
Klomp et al.

(10) Patent No.: US 7,535,223 B2
(45) Date of Patent: May 19, 2009

(54) METHOD AND APPARATUS FOR POLARIZATION TRANSFER IN THE DETECTION ENHANCEMENT OF MR SPECTROSCOPY

(75) Inventors: Dennis Klomp, Malden (NL); Arend Heerschap, Plasmolen (NL); Arno Kentgens, Oosterbout (NL)

(73) Assignee: Radboud University Nijmegen Medical Centre (NL)

( * ) Notice: Subject to any disclaimer, the term of this patent is extended or adjusted under 35 U.S.C. 154(b) by 104 days.

(21) Appl. No.: 11/733,301

(22) Filed: Apr. 10, 2007

(65) Prior Publication Data

US 2007/0247152 A1 Oct. 25, 2007

(30) Foreign Application Priority Data

Apr. 10, 2006 (EP) .................. 06007506

(51) Int. Cl.
*G01V 3/00* (2006.01)
(52) U.S. Cl. ........................ 324/307; 324/309
(58) Field of Classification Search ................ 324/307, 324/309
See application file for complete search history.

(56) References Cited

U.S. PATENT DOCUMENTS

| | | | |
|---|---|---|---|
| 4,521,732 A | | 6/1985 | Pegg et al. |
| 4,843,321 A | * | 6/1989 | Sotak ................ 324/309 |
| 4,987,369 A | * | 1/1991 | Van Stapele et al. ........ 324/307 |
| 5,894,221 A | * | 4/1999 | Watanabe et al. ........... 324/307 |
| 7,382,126 B2 | * | 6/2008 | Bottcher et al. ............. 324/307 |

FOREIGN PATENT DOCUMENTS

EP 1 033 581 9/2000

OTHER PUBLICATIONS

"In Vivo 3D Localized $^{13}$C Spectroscopy Using Modified INEPT and DEPT," Watanabe et al, J. Mag. Res. vol. 134 (1998) pp. 214-222.
"Proton-Enhanced $^{13}$C Imaging/Spectroscopy by Polarization Transfer," Swanson et al, Mag. Res. in Med., vol. 15 (1990) pp. 102-111.
"Single- and Multiple-Frequency-Shifted Laminar Pulses," Patt, J. Mag. Res., vol. 96 (1992), pp. 94-102.
"A Complete Digital Radio-Frequency Source for Nuclear Magnetic Resonance Spectroscopy," Yun et al, Review of Scientific Instruments, vol. 73, No. 9 (2002) pp. 3329-3331.

* cited by examiner

*Primary Examiner*—Louis M Arana
(74) *Attorney, Agent, or Firm*—Schiff Hardin LLP

(57) ABSTRACT

In a method and apparatus for detection and spectral editing in MR spectroscopy by polarization transfer in which the high spin population difference of two or more energy levels of a particular nuclear spin system is transferred to the energy levels of an other nuclear spin system with lower spin population difference, all RF pulses to be irradiated are irradiated sequentially, i.e. with defined time interval to each other, so that at no time of the sequence are different RF pulses irradiated concurrently in an overlapping manner. The sequential succession of the RF pulses causes the polarization transfer between the two spin systems of atomic nuclei involved. The sequence of the RF pulses in each domain of the respective nuclei is completely symmetric.

12 Claims, 11 Drawing Sheets

TIME

FREQUENCY

TIME

FREQUENCY

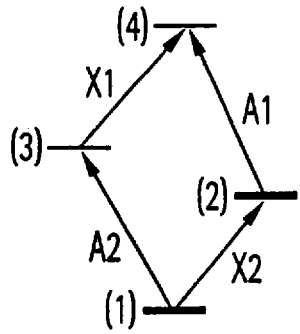
Fig. 4A
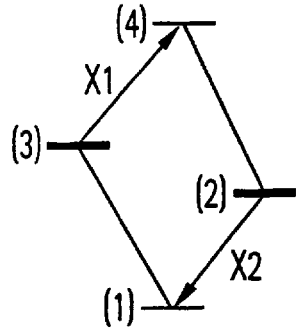
Fig. 4B
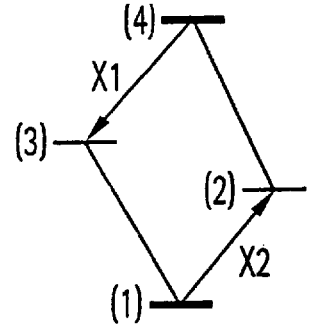
Fig. 4C
Fig. 8A
```
                          1
DUBLET ─────▶   1    1
TRIPLET ─────▶ 1   2   1
              1   3   3   1
            1   4   6   4   1
          1   5  10  10   5   1
        1   6  15  20  15   6   1
```
n
0
1
2
3
4
5
6
Fig. 8B
```
                1
              -3    5
           -7    2    9
        -11   -9   15   13
     -15   -28    6   36   17
  -19   -55   -30   50   65   21
-23  -90  -105   20  135  102   25
```
──▶
SIGNAL ENHANCEMENT
FOR $A_nX$- SPIN-SYSTEMS

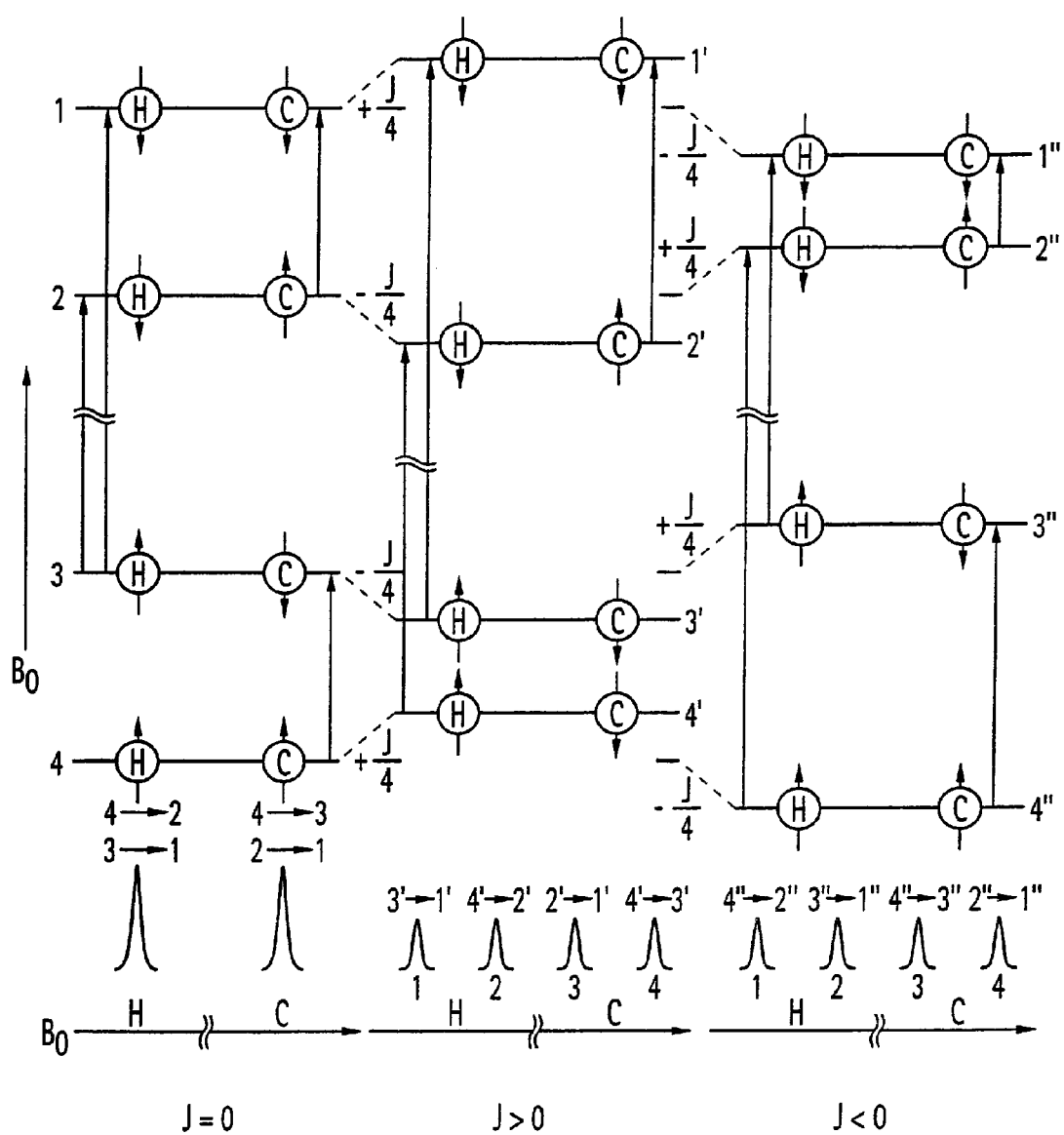

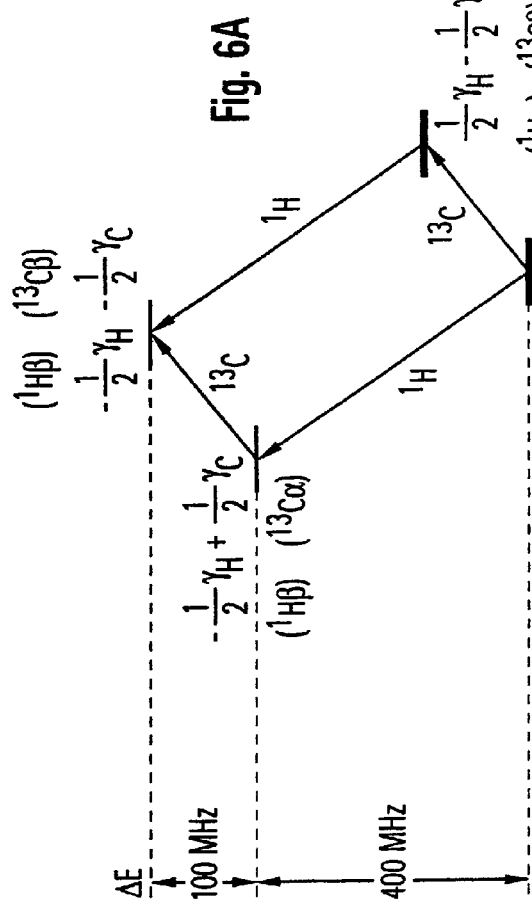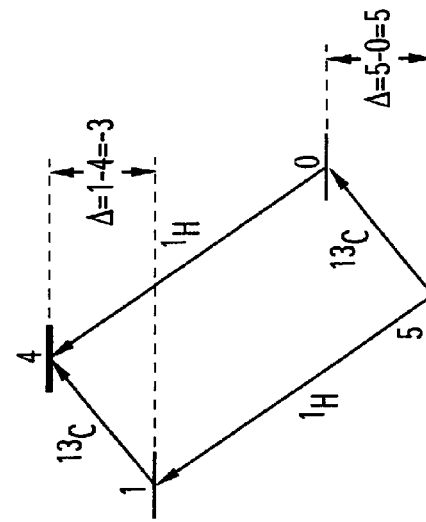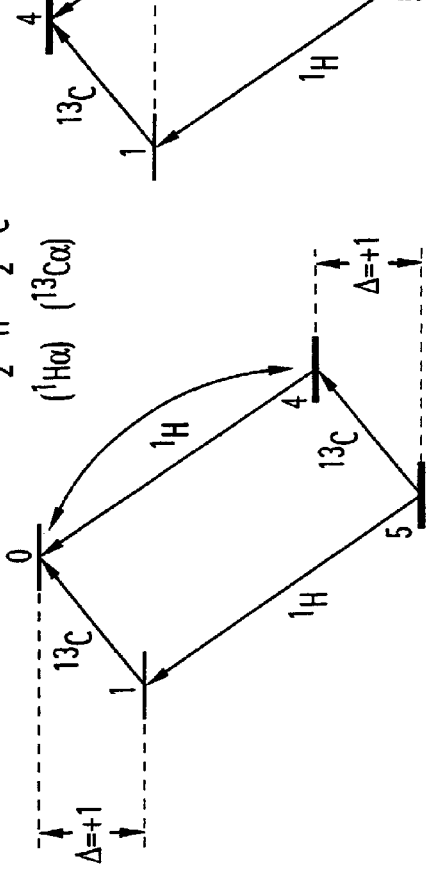
Fig. 6A
Fig. 6B
Fig. 6C

METHOD AND APPARATUS FOR POLARIZATION TRANSFER IN THE DETECTION ENHANCEMENT OF MR SPECTROSCOPY

BACKGROUND OF THE INVENTION

1. Field of the Invention

The present invention relates to magnetic resonance (MR) spectroscopy, as applied in radiological diagnostics in the form of in vivo magnetic resonance spectroscopy (MRS) for the assessment of metabolic compounds in the human body. More particularly, the present invention relates to modifications of magnetic resonance experiments and also to an apparatus for execution of these experiments, to transfer polarization between nuclei with the aim to enhance the detection sensitivity of compounds by magnetic resonance or to enable spectral editing of molecular fragments based on their coupling to specific isotopes.

2. Description of the Prior Art

Magnetic resonance spectroscopy (MRS) like magnetic resonance imaging (MRI) is based on the nuclear magnetic resonance effect which was discovered in 1946 and in the very beginning used for examination of the magnetic characteristics of nuclei. Later it was found that the resonance signal of a nuclei is also influenced by its chemical surrounding and that this so-called chemical shift can be used to characterize chemical substances. This kind of examination was established as the so-called "high resolution NMR" in vitro. This high resolution NMR finds its application in the physical, chemical, biochemical and pharmaceutical research and development in order to analyze the structure of complex macro molecules.

In the late seventies of the 20th century it was newly discovered that the resonance signal can be used for non-invasive imaging of living species, and such imaging has become one of the most important radiological examination methods in medicine.

However, it was not ignored that magnetic resonance imaging further contains chemical information, which can be used to analyze biochemical reactions, particularly metabolism in vivo. This kind of NMR spectroscopy with spatial resolution related to the in vivo organism or related to live organs was called "in vivo spectroscopy" or "clinical nuclear magnetic resonance spectroscopy (MRS)" in contrast to "high resolution NMR" in the test tube, which is usually carried out in the laboratory, respectively in contrast to the mere magnetic resonance imaging (MRI).

In the following, the physical basics of nuclear magnetic resonance will be explained:

In MRS as well as in MRI the object to be examined (the patient or the organ) is exposed to a strong, constant magnetic field. Thereby, the nuclear spins of the atoms in the object, which were oriented randomly before, are aligned, building discrete energy levels. Radio frequency energy can cause transitions between these energy levels. If a radio frequency pulse e.g. enables a steady state population of the levels, an induced signal can be obtained after the switch off of the radio frequency field. Because of application of inhomogeneous magnetic fields initiated by so-called gradient coils, the object to be investigated can be excited selectively and the signals can be spatially encoded.

In MRS the data sampling is usually done in the so-called time domain, the sampling of the MRI data in the so-called k-space (frequency space). The MR spectrum in the frequency domain, namely the MRI image in the so-called imaging space, is correlated with the sampled data by Fourier-transformation. A volume excitation in the object is achieved in the object by slice selective radio frequency pulses, namely by simultaneous application of gradient pulses. For the excitation of a cuboid e.g. three slice selective high frequency pulses in three orthogonal directions are applied in the MRS. Normally, these are three Sinc-shaped, Gaussian-shaped or hyperbolic-shaped RF pulses, which are irradiated simultaneously with rectangular or trapezoid gradient pulses in the object to be examined. The irradiation of the RF pulses has to be effected by an RF antenna.

By the combination of the pulses a frequency spectrum in the range of a specific nuclear resonance frequency is radiated in a well-defined cuboid-shaped area of the object to be examined. The respective nuclei in this selected range (volume of interest, VOI) react on their part with electromagnetic response signals (electromotive force EMF), which are detected in the form of a sum signal (free induction decay signal FID-signal), respectively in form of a (half) spin echo signal by a special receiving condition of said RF antennas. This analogue signal (FID or echo) is sampled by switching of an ADC (analog-digital-converter), digitalized and saved on a computational apparatus, respectively Fourier-transformed, whereby a so-called "spectrum" can be displayed on a visualization apparatus (monitor).

Both components of the measured signals (FID or echo signals) characterize the projections of said oscillation behavior of the nuclear magnetization vector $\overline{M}$ in the x-y-plane of a stationary frame of reference (laboratory system of coordinates).

The temporary decay of the signal is determined by the $T_2$-weighted transversal relaxation. The transversal relaxation leads to the disappearance of the time-dependent transversal magnetization $\overline{M}_{xy}(t)$, whereas the $T_2$-time, more particularly the $T_2^*$-time, which considers local $B_0$-field inhomogeneities $\Delta B_0$ according to the equation $$\frac{1}{T_2^*} = \frac{1}{T_2} + \gamma \Delta B_0, \quad (1)$$

as a characteristic time constant is determining the decay of the FID or echo signal. In the above equation, $\gamma$ represents the gyromagnetic ratio, which describes the energetic coupling constant of the respective nuclei to the external magnetic field and which is a fixed constant of the respective nucleic species The complex and time-dependent (therefore three-dimensional) FID or echo signal itself can be considered as the electromagnetic response to one or more circular high frequency exciting pulses, which have been irradiated into the respective substance or the tissue to be examined before.

In the case of the substance or tissue consisting of only one specific nucleic species (e.g. protons in pure water) and the RF excitation pulse being irradiated with a frequency, which corresponds exactly to the Lamor frequency of the protons (63,8 MHz at 1,5 Tesla), the measured FID respectively echo signal of the water protons will not contain any harmonic/periodic parts (sinus- or cosinus-shaped components), as in the (at 63,8 MHz) rotating referential system a precession/rotation of the transversal magnetization does not take place. (The relative movement in the rotation direction equals zero). Only the relaxation-dependent exponential reduction of the transversal magnetization vector is measurable, which constitutes a non-modulated exponential function (dashed line in FIG. 2A).

If the irradiated RF excitation pulse shows a frequency, which does not exactly corresponds to the water protons (e.g.

63.8 MHZ+400 Hz), but provokes an excitation of the protons due to its pulse amplitude anyhow, the measured FID respectively echo signal, at a referential frequency for the data acquisition equaling the frequency of the RF pulse, will contain a harmonic part of 400 Hz, which is—according to FIG. 2A—modulated to the exponential relaxation decay $$e^{\frac{-t}{T_2}}.$$

In general, the substance respectively the object to be examined (in the medical in vivo spectroscopy) will firstly not contain only one nucleic species (1H, 31P, 13C), but a plurality of nucleic species to be analyzed. Secondly, the nuclei of the same species will show relatively to each other different resonances (Lamor frequencies) due to their different integration into different molecules (different chemical environment) and can be distinguished as so-called metabolites.

In the (in vivo) proton spectroscopy the frequency range of most metabolite signals is about 10 ppm, the spectral width in the (in vivo) phosphor spectroscopy is ca. 30 ppm and in (in vivo) $^{13}$C-spectroscopy the resonances in the spectra are spread over an area of about 200 ppm. The indication of the changing of the resonance frequency δ relative to the system frequency (RF center frequency $v_0$) in ppm (parts per million), i.e. in millionth of the resonance frequency according to the equation $$\delta = \frac{v_{substance} - v_0}{v_0} \cdot 10^6 \quad (4)$$

is advantageously independent of the strength of the magnetic field.

In general, the FID or echo signal forms a temporally dependent response signal—a so-called "signal imaging/representation in the time domain"—in whose exponential process all resonances ($\omega_x$, x∈N) of the excited nuclei in the respective metabolites are modulated and are superimposed and frequency-encoded.

An FID, which according to FIG. 2A contains the frequency response of only one metabolite, delivers according to FIG. 2B only one resonance line.

An FID, which contains e.g. the frequency responses of three different metabolites, is shown in FIG. 3A. It can be seen, that the FID respectively echo signal in FIG. 3A is encoded considerably more complex than the FID respectively echo signal of FIG. 2A, which shows only one frequency. This encoding can by decrypted by a Fourier-transformation and ordered by the respective resonance frequencies, whereby according to FIG. 3B a three-component spectrum with so-called resonance lines at $\omega_0$, $\omega_1$, and $\omega_2$ is obtained.

The Fourier transform of the FID respectively echo signals (FIGS. 2B, 3B) is generally referred to as spectrum. It is also referred to as "signal imaging/representation in the frequency domain".

Although, as already mentioned, the gyromagnetic ratio γ (equation (1)) is a fixed constant of the respective nucleic species (e.g. for the proton is γ/2π=42, 577 MHz/T), in the same (constant) outer magnetic field slightly different resonance frequencies can be seen in NMR experiments, in which the examined nuclei are integrated in different molecules. Responsible for this are the electrons in the molecule, which cause the chemical binding. They shield the outer (external) magnetic field, so that the nuclei depending on the state of binding "sees" different magnetic fields ($B_K$), which causes the already mentioned slight displacement of the respective resonance frequency and is referred to as "chemical shift $\delta_K$":

$$B_k = B_0 - \delta_K B_0 \quad (5)$$

In a molecular complex there is often a number of resonance lines, which can be assigned to single molecule groups. Quantitatively, according to equation (4) the chemical shift is mostly given in ppm relative to a reference line ($v_0$).

Apart from the chemical shift, also a fine splitting of the nuclei resonance lines in form of multiplet lines (doublets, triplets, quartets, etc.) can be seen often. Responsible for this is the magnetic interaction (spin-spin-coupling) among the nuclei, which is not arranged over the space, but indirectly over the electrons of the chemical binding. For the analysis of the spectra with a fine structure usually the energy function (Hamilton operator $\hat{H}$) with the interaction energy $J_{kl}$ (scalar energy coupling constant) between the different spin states $$\hat{J}_k \text{ and } \hat{J}_l$$

$$\hat{H} = -\sum \gamma \hbar B_0 (1 - \delta_k) \hat{J}_{zk} + \sum_{k,l} J_{kl} \hat{\vec{J}}_k \hat{\vec{J}}_l \quad (6)$$

whose eigenvalues and eigenfunctions describe the measured spectrum corresponding to the assumed molecular model. In this way, the structural clarification of (macro-) molecules is advantageously realized in chemistry and biochemistry. In the medical sector typical metabolites can be detected non-invasively on the basis of their spectra in vivo.

In imaging the low sensitivity of magnetic resonance using the proton signals of water is not a major issue as $^1$H nuclei have a large magnetic moment and water is abundantly present in the body. In MR spectroscopy, however, usually compounds at much lower tissue concentrations are observed and often also many MR nuclei with interesting physiologic information (e.g. $^{31}$P, $^{13}$C, $^{15}$N) are less sensitive than the $^1$H nucleus. A known class of methods for detection improvement in NMR-spectroscopy is known as polarization transfer, in which the high population difference of two or more energy levels of a particular nuclear spin system is transferred to the energy levels of a less populated other nuclear spin system by spin spin-coupling.

The principle of the polarization transfer-based detection improvement is explained in detail in the following:

Simplifying, the example contains a two-spin-system consisting of each one sensitive and one insensitive (slightly sensitive) nuclei, e.g. $^1$H and $^{13}$C.

In a magnetic field $B_0$ such nuclei (spin quantum number ½) are able to adopt each to two discrete energy states. The transition between energy levels involves the absorption or emission of an electronic quantum $$\hbar\omega = \Delta E = \gamma \hbar B_0 \quad (7)$$

The allocation/population of the energy levels in the external magnetic field $B_0$ takes place according to the Boltzmann-statistic $$\frac{N_q}{N_p} = e^{\frac{\Delta E}{kT}} \approx 1 - \frac{\gamma \hbar B_0}{kT} \quad (8)$$

Resulting therefrom is an excess of nuclei-magnetic moments parallelly aligned to the magnetic field $B_0$.

Decisive for the population difference between two states $E_q$ and $E_p$ is the gyromagnetic relation $\gamma$ of the respective nuclei, which changes its spin-adjustment/orientation during the transfer from $E_p \rightarrow E_q$. For states, which belong to the transfers of a sensitive nucleic species A (high $\gamma$), a greater population difference results than for states, which belong to the transfers of an insensitive nucleic species X (low $\gamma$).

The population in the term scheme of such an AX-system consisting of a strongly sensitive nuclei (A) and a slightly sensitive nuclei (X) is schematically shown in FIGS. 4A, 4B and 4C.

FIG. 4A shows the state of equilibrium, in which the two lowest energy levels (1) and (2) are populated the most (symbolized by bold bars).

If an interchanging of the respective spin populations is achieved by a (selective) population inversion for an A-line (A1 or A2) in the NMR-spectrum, so the term scheme of FIG. 4B which now shows fortified absorption (X1) and fortified emission (X2) for the X-transfers, respectively the term scheme of FIG. 4C whereby X1 shows fortified emission and X2 fortified absorption, becomes valid. In both cases (FIGS. 4B, 4C) the population balance is perturbed by selective population inversion between the states (1) and (3) respectively between the states (2) and (4).

The population difference corresponding to the signal intensity, which was beforehand decisive for the sensitive nuclei, is now valid for the insensitive nuclei. This phenomenon is referred to as polarization transfer, which is used for enforcing the signal of NMR-insensitive nucleic species (X).

Of general interest is thereby the sensitivity improvement of $^1$H-coupled spectra of insensitive nuclei, as e.g. $^{13}$C (but also $^{15}$N or $^{31}$P), i.e. the intensity increasement of $XA_n$-spin systems with $A=^1H$ and $X=^{13}C$.

The diagram of an energy level of a CH-spin system (n=1) with different coupling is shown in FIGS. 5A, 5B and 5C.

FIG. 5A shows the four energy levels 1, 2, 3 and 4 without coupling onto the external magnetic field $B_0$, which are possible due to different C-H-spin modulations, i.e. for the scalar energy-coupling-constant J=O. As in this case the $^1$H-transfers 3→1 and 4→2, respectively the $^{13}$C-transfers 2→1 and 4→3 are energetically equal, only one $^1$H-line and one $^{13}$C-line are resulting in the spectrum (no splitting or no hyperfine structure).

In FIGS. 5B and 5C a different example is shown, in which an energetic coupling of the C-H-spin states takes place, whereby in case of FIG. 5B the energy levels of the parallel spin states ($\uparrow\uparrow, \downarrow\downarrow$) are increased by J/4 and the energy levels of the antiparallel spin states ($\uparrow\downarrow, \downarrow\uparrow$) are decreased by J/4. In FIG. 5C an exactly inverse example is shown. The coupling $\gamma_{1H} \approx 4\gamma_{13C}$ leads in every case to each two energetically different transfers of the respective atomic nucleic species, which leads to a double fine structure splitting in the spectrum, i.e. to two directly neighboring spectral lines in form of a doublet. Each nucleic species alone thereby experiences an overall energy changing of J.

To calculate the population relations (relative population-respectively transfer probability) for the polarization transfer and which is thereby relevant for the signal enhancement to be effected, it is advantageous, to regard the term scheme of FIGS. 4A and 4C more closely, i.e. quantitatively (see FIGS. 6A, 6B, 6C).

In FIG. 6A the lowest energy level features an energy of $$\frac{1}{2}\gamma_H + \frac{1}{2}\gamma_C$$

which is proportional to the population probability), while the other energy levels feature energies respectively population probabilities of $$\frac{1}{2}\gamma_H - \frac{1}{2}\gamma_C, -\frac{1}{2}\gamma_H + \frac{1}{2}\gamma_C \text{ and in } \frac{1}{2}\gamma_H - \frac{1}{2}\gamma_C$$

ascending order, corresponding to the respective coupled spin states ($\alpha\alpha = \uparrow\uparrow$=parallel to $B_0$), ($\alpha\beta=\uparrow\downarrow$), ($\beta\alpha=\downarrow\uparrow$), ($\beta\beta=\downarrow\downarrow$=antiparallel to $B_0$).

After a suitable (spin) preparation of the system by irradiation of suitable electromagnetic high frequency pulses in the context of a defined pulse sequence, energy can be added selectively to the system, in a way that the $\alpha\beta$-coupling changes into the energetically higher $\beta\beta$-coupling. After the preparation, the system has spin-spin-pairs, which are parallel ($\alpha\alpha=\uparrow\uparrow$) and antiparallel ($\beta\beta=\downarrow\downarrow$) to the magnetic field $B_0$.

If, for clarity, one adds to the energy levels the constant energy amount of $$\frac{1}{2}\gamma_H + \frac{1}{2}\gamma_C,$$

the energy states $\gamma_H+\gamma_C$, $\gamma_H$, $\gamma_C$ and 0 are obtained. If the relation of the nucleic sensitivities of $^1$H and $^{13}$C ($\gamma_H=4$ and $\gamma_C=1$) is taken into account, the relative values of 5, 4, 1 and 0 are obtained for the energy levels according to FIG. 6B. These values correspond as well, as already mentioned, to the relative population probabilities respectively the relative populations, as the magnetic moment $\bar{\mu}$ characterizing the sensitivity defines the differences of the energy levels as well as the population probabilities (according to Boltzmann).

As can be seen clearly in FIG. 6B, the population difference of the $^{13}$C-transfers is relatively low ($\Delta=1-0=+1$; $\Delta=5-4=+1$) in the unexcited system. According to that the $^{13}$C-doublet features a low NMR-signal intensity compared to the $^1$H-doublet. If the system, however, is forced into a higher-energy state by energy transfer (alignment of the spin-pairs antiparallel to $B_0$), population differences of $^{13}$C-transfers result, which lead to an emission enhancement of $\Delta=1-4=-3$ as well as an absorption enhancement of $\Delta=5-0=+5$ in the spectrum (FIG. 6C).

This signal enhancement of an X-doublet in the MR-spectrum (e.g. $X=^{13}C$) is shown in FIG. 7A. The unit of the ordinates was chosen randomly. Important is the significant enhancement of the two X-doublet lines.

The enhancement to a 3-atomic AX-spin system (e.g. to a $CH_2$-group) leads to a significantly more complex term scheme of the energy levels and—as can be shown—to an X-triplet with the relevant intensities (1)-(2)-(1) in the spectrum (FIG. 7B). A signal enhancement leads to values of (−7)-(2)-(9) in this system.

The intensity enhancement, which is obtained in the general enhancement to $A_nX$-spin systems ($A=^1H$, $X=^{13}C$), can be calculated by comparison with Pascal's Triangle according to FIGS. 8A and 8B.

Line numbers and relative intensities for an X-multiplet of an $A_n$X-group (A=$^1$H) at Boltzmann-distribution (FIG. 8A) and after population inversion (FIG. 8B) are shown. The respective triangle is obtained by combining the (integral) energy level transfers of the underlying term scheme.

The preparation of the spin system and thereby the realization of the polarization transfer can be achieved by using different RF pulse sequences. Most common is the INEPT-method (Insensitive Nuclei Enhanced by Polarization Transfer, Morris, Freeman, J. Am. Chem. Soc. 101, 760-762 (1979)).

Further methods are e.g. Refocused-INEPT, DEPT (Distortionless Enhancement by Polarization Transfer), SINEPT, etc.

Generally, all these methods are based—as will be explained later in more detail—on the concurrent appliance (irradiation) of RF pulses on the different frequencies of the participating nucleic species (i.e. for example $^1$H, $^{13}$C). This results in the disadvantage, that NMR apparatuses, which are not able to concurrently send in the different frequencies of the participating nuclei, are also not able to execute NMR experiments with polarization transfer.

SUMMARY OF THE INVENTION

An object of the present invention is to provide a method and an apparatus which is able to execute the method, which enable NMR experiments with polarization transfer without the concurrent application of RF pulses of different frequencies.

This object is achieved in accordance with the present invention by a method for improvement of the detection in NMR spectroscopy or spectral editing of molecular fragments by polarization transfer in which the high population difference of two or more energy levels of a particular nuclear spin system (A) is transferred to the energy levels of an other nuclear spin system with lower spin population difference (X), wherein all RF pulses to be irradiated sequentially, i.e. with defined time interval to each other, so that at no time of the sequence are different phase coherent RF pulses irradiated concurrently in an overlapping manner, so the sequential succession of the RF pulses causes a polarization transfer between the two spin systems of atomic nuclei involved (A), (X), wherein the sequence of the RF pulses in each domain of the respective nuclei is completely symmetric.

The method modifies the RF pulse ordering of a DEPT sequence.

In particular, the RF pulse sequence includes the steps:

irradiating a first A-selective $90_x°(A)$-RF pulse for excitation of the nuclei (A) with high spin population difference, irradiating the center of a second A-selective $180_y°(A)$-RF pulse after a time $\tau_1+\tau_2$ starting from the center of the first HF pulse, irradiating the center of a third X-selective $90_x°(X)$-RF pulse after the time $\tau_2$ starting from the center of the second HF pulse, irradiating the center of a fourth A-selective $\alpha_y(A)$-RF pulse after the time $\tau_1$ starting from the center of the third HF pulse, irradiating the center of a fifth X-selective $180_x°(X)$-RF pulse after the time $\tau_3$ starting from the center of the fourth RF pulse, acquiring of the X-nuclear resonance signal by detection of the FID signal after a time $\tau_3+\tau_1$ starting from the center of the fifth RF pulse.

For the time interval $\tau_1$ applies $\tau_1=1/2J$, whereby J represents the XA coupling constant, whereby, according to a special embodiment of the invention, long range coupling is used for polarization transfer.

Advantageously for sequential succession of RF pulses, the time interval $\tau_2$ comprises at least the sum of the half second A-selective $180_y°(A)$-RF pulse and the half third X-selective $90_x°(X)$-RF pulse.

Further advantageously the time interval $\tau_3$ includes at least the sum of the half fourth A-selective $\theta_y(A)$-HF-pulse and the half fifth X-selective $180_x°(X)$-RF pulse.

Further advantageously $\tau_2$ and $\tau_3$ are chosen as independent variables in order to influence the spectral shape of spin systems, which have strong homonuclear couplings (i.e. like ABX systems).

Further advantageously the coupling for the X-multiplet of an $A_n$X group is regarded, whereby n=1, 2, 3.

Further advantageously the species of atomic nuclei (A) with high spin population difference represents $^1$H, $^{13}$C, $^{15}$N or $^{19}$F-nuclei and/or the species of atomic nuclei (X) with low spin population difference represents $^{13}$C, $^{31}$P, $^{15}$N, $^{19}$F or $^1$H-nuclei.

The above object also is achieved by an apparatus having only a single broadband transmit channel which is phase coherent in order to enable polarization transfer and/or having only a single broadband transmit channel which is phase-continuous, so $\tau_2$ and $\tau_3$ can be chosen to obtain the correct phases for all RF pulses in order to enable polarization transfer.

The apparatus is suitable for the execution of a method as described above that can be combined with spatial localization methods with magnetic field gradients and/or RF coils.

For sequential succession of RF pulses, the time interval $\tau_2$ comprises the sum of the half second A-selective $180_y°(A)$-RF pulse and the half third X-selective $90_x°(X)$-RF pulse and the time interval $\tau_3$ comprises the sum of the half fourth A-selective $\alpha_y(A)$-FF-pulse and the half fifth X-selective $180_x°(X)$-RF pulse.

In special cases the coupling for the X-multiplet of an $A_n$X group is regarded, whereby n=1, 2, 3.

More particular the invention is advantageously directed to a method where the high sensitive species of atomic nuclei (A) represents $^1$H-nuclei and/or the low sensitive species of atomic nuclei (X) represents $^{13}$C-nuclei

DESCRIPTION OF THE DRAWINGS

FIG. 4A shows a simplified term scheme of an AX-system consisting of a sensitive nucleus (A) and an insensitive nucleus (X) in the state of balance.

FIG. 4B shows the AX-term scheme in a disturbed balance after selective population inversion between the states (1) and (3).

FIG. 4C shows the AX-term scheme in the disturbed equilibrium after selective population inversion between the levels (2) and (4).

FIG. 5A shows the energy level diagram of an CH-spin system without coupling.

FIG. 5B shows the energy level diagram of an CH-spin system with positive coupling (J>0).

FIG. 5C shows the energy level diagram of an CH-spin system with negative coupling (J<0).

FIG. 6A shows a quantitative view of the term scheme according to FIG. 4A.

FIG. 6B shows the term scheme according to FIG. 4A respectively 6A in a concise view of the relative population probability.

FIG. 6C quantitatively shows the effect of the polarization transfer on the signal enhancement in the term scheme of FIG. 4C.

FIG. 8A shows the Pascal triangle of the relative intensities of a multiplet according to the Boltzmann-distribution.

FIG. 8B shows the Pascal triangle of the relative intensities of a multiplet after population inversion.

DESCRIPTION OF THE PREFERRED EMBODIMENTS

The methods of the clinical MR-spectroscopy primarily differ from those of the conventional MR-imaging only in that in addition to the spatial resolution, the chemical shift, i.e. the hyperfine structure, is to be resolved as well. This can be realized by conventional magnetic resonance imaging apparatuses, which is why these are preferably used in the clinical MR-spectroscopy and the method according to the present invention—modification of NMR-experiments, which use polarization transfer for detection enhancement of insensitive nuclei—is to be primarily implemented on such apparatuses.

It is to be noted, however, that the method according to the present invention can also be applied to high-field-in-vivo-MR-systems (momentarily up to 7 Tesla for human applications and 17 Tesla for other applications), which are isolatedly developed in isolation and used, as well as to high resolution NMR-spectrometers.

Figure 1:
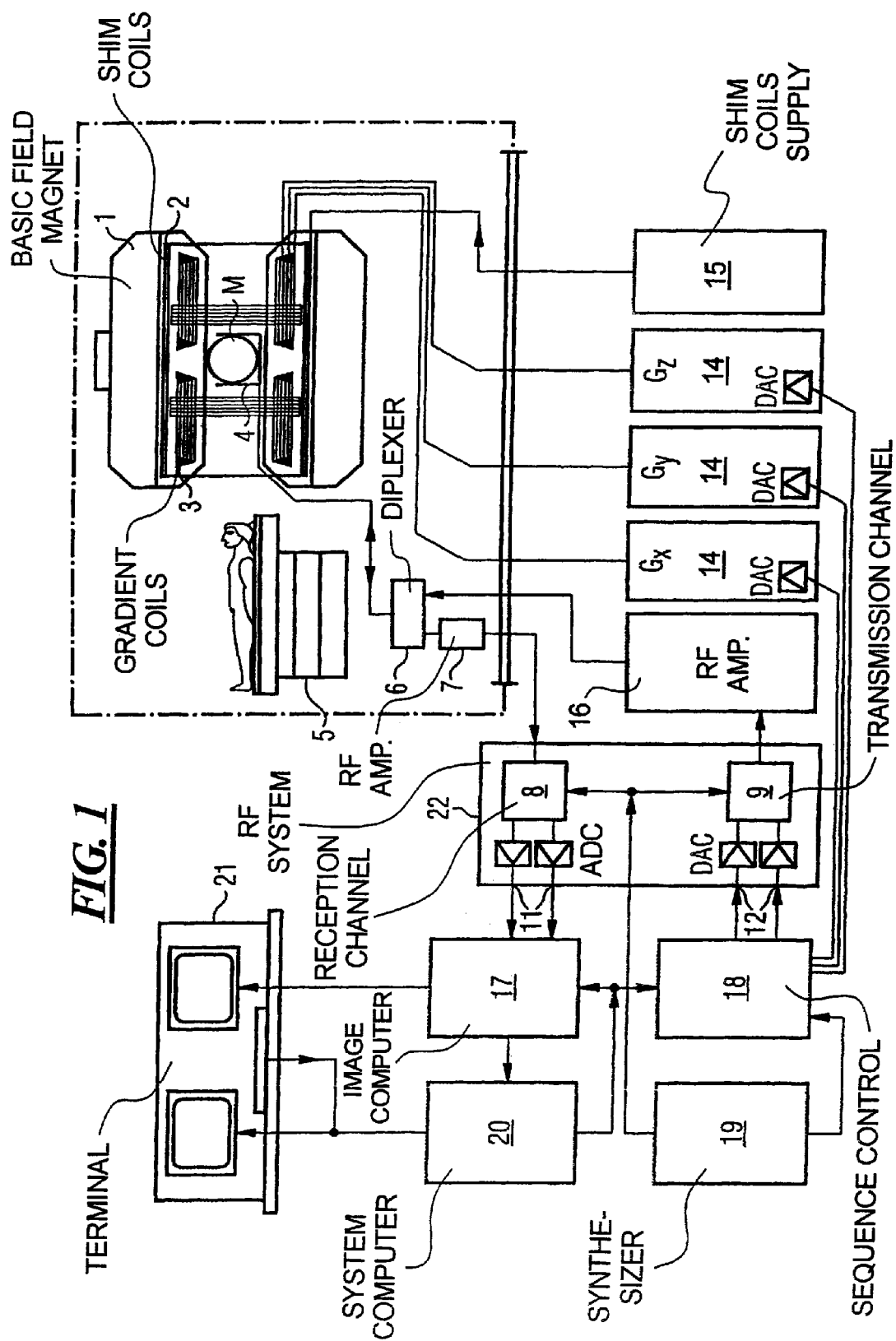
FIG. 1 shows a schematic illustration of an apparatus for magnetic resonance imaging.
Figure 2A:
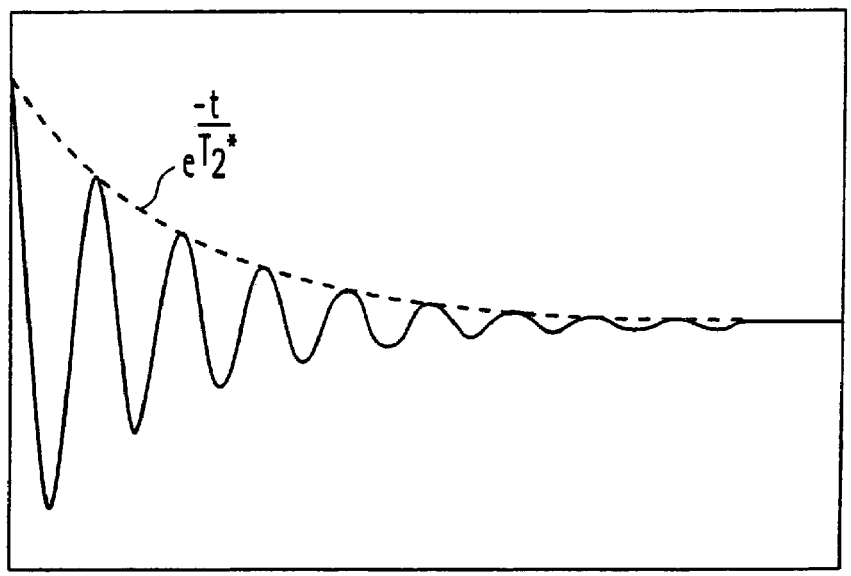
FIG. 2A shows the temporal course of the cross-/transverse-magnetization, which is characterized by a single resonance, in form of an FID-signal.
Figure 2B:
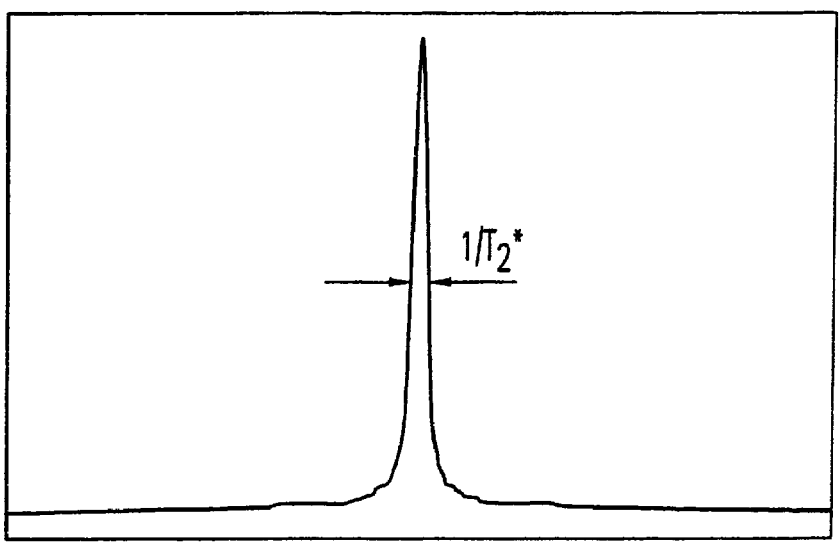
FIG. 2B shows the frequency spectrum according to FIG. 2A generated by Fourier transformation.
Figure 3A:
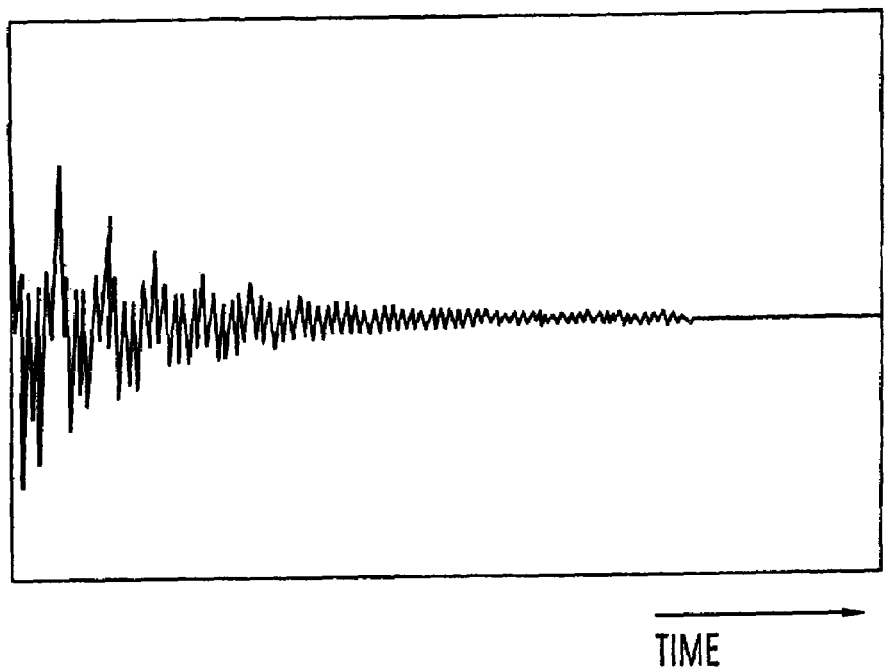
FIG. 3A shows an FID-signal, which has three resonances.
Figure 3B:
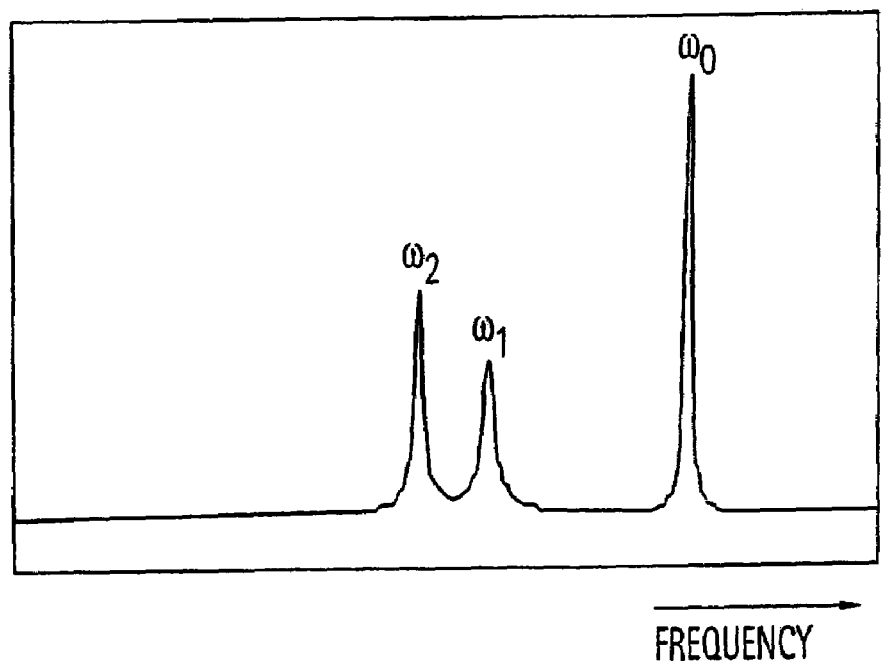
FIG. 3B shows the frequency spectrum according to FIG. 3A with its three resonance lines.
Figure 7A:
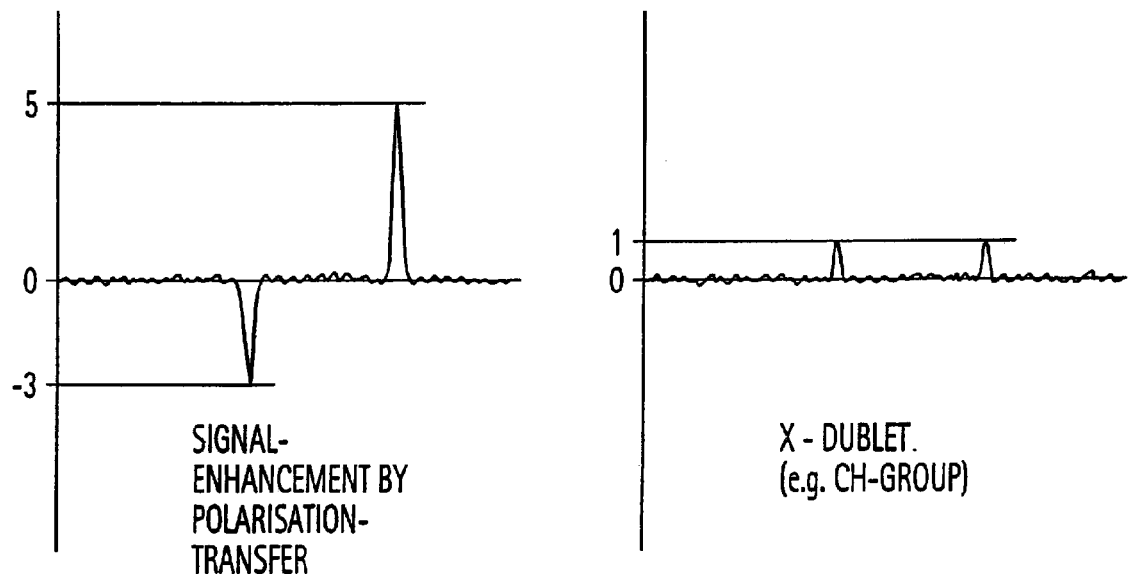
FIG. 7A shows the signal enhancement of an X-doublet in the NMR-spectrum.
Figure 7B:
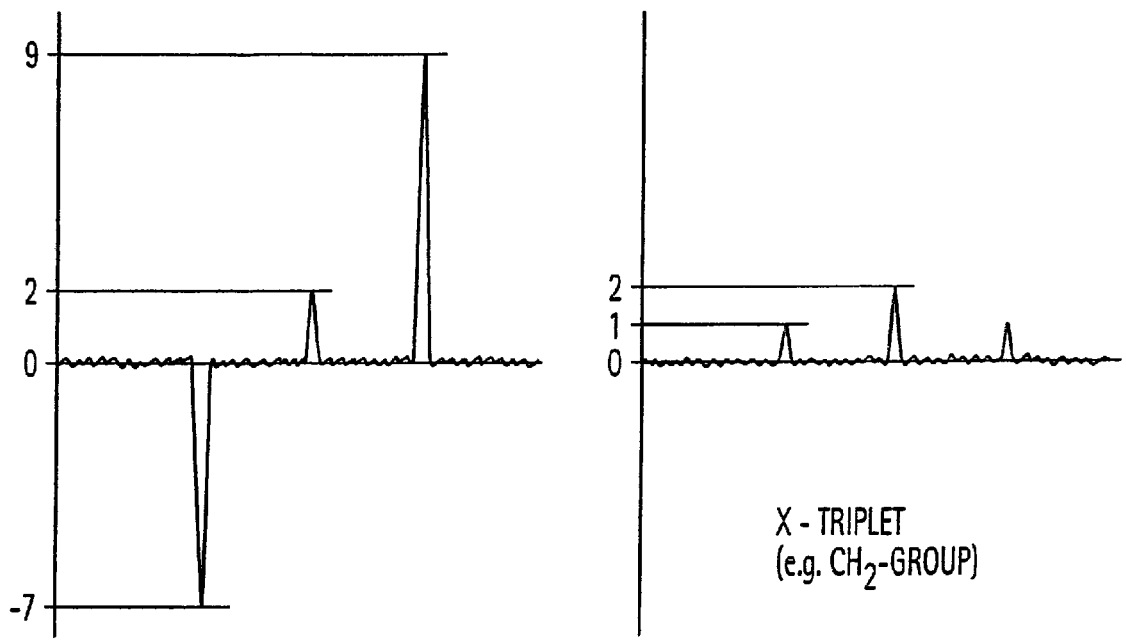
FIG. 7B shows the signal enhancement of an X-triplet in the NMR-spectrum.

FIG. 1 shows a schematic illustration of a magnetic resonance imaging (magnetic resonance tomography) apparatus for generating a magnetic resonance spectrum of a subject according to the present invention. The basic structure of the magnetic resonance imaging apparatus corresponds to that of a conventional imaging apparatus (with the difference described below). A basic field magnet 1 generates a temporally constant, strong magnetic field for the polarization or alignment of the nuclear spins in the examination region of a subject such as, for example, part of a human body to be examined. The high homogeneity of the basic magnetic field required for the magnetic resonance measurement is defined in a spherical measurement volume M into which the parts of the human body to be examined are introduced. For supporting the homogeneity demands and, in particular, for eliminating time-invariable influences, shim plates of ferromagnetic material are attached at suitable locations. Time-variable influences are eliminated by shim coils 2 that are driven by a shim power supply 15.

A cylindrical gradient coil system 3 that is composed of three sub-windings is introduced into the basic field magnet 1. Each sub-winding is supplied with power by an amplifier 14 for generating a linear gradient field in the respective direction of the Cartesian coordinate system. The first subwinding of the gradient field system 3 generates a gradient Gx in the x-direction, the second sub-winding generates a gradient Gy in the y-direction and the third sub-winding generates a gradient Gz in the z-direction. Each amplifier 14 has a digital-to-analog converter that is driven by a sequence controller 18 for generating gradient pulses at the correct time.

Located within the gradient field system 3 is a radio frequency antenna 4 that converts the RF pulses output by a RF power amplifier 10 into an electromagnetic alternating field for exciting the nuclei of the examination subject or of the region under examination in the subject. The RF antenna 4 is composed of one or more RF transmission coils and one or more RF reception coils in the form of a preferably linear arrangement of component coils. The RF reception coils of the RF antenna 4 also convert the alternating field emanating from the precessing nuclear spins, i.e. the nuclear magnetic resonance echo signals (usually produced by a pulse sequence composed of one or more radiofrequency pulses and one or more gradient pulses), into a voltage that is supplied via an amplifier 7 to an RF reception channel 8 of an RF system 22. The RF system 22 further has a transmission channel 9 in which the RF pulses for the excitation of the magnetic resonance are generated. The respective RF pulses are defined digitally as a sequence of complex numbers on the basis of a pulse sequence in the sequence controller 18 prescribed by the system computer 20. The real part and the imaginary part of this number sequency are supplied via respective inputs 12 to a digital-to-analog converter in the RF system 22 and are supplied therefrom to a transmission channel 9. In the transmission channel 9, the pulse sequences are modulated on a phase coherent RF carrier signal having a base frequency corresponding to the resonant frequency of the nuclear spins in the measurement volume.

The switching from transmission to reception mode ensues via a transmission-reception duplexer 6. The RF transmission coil of the RF antenna 4 emits the RF pulses for the excitation of the nuclear spins into the measurement volume M and samples resultant echo signals via the RF reception coils. The correspondingly acquired magnetic resonance signals are phase-sensitively demodulated in the reception channel 8 of the RF system 22 and are converted via respective analog-to-digital converters into a real part and an imaginary part of the measured signal, which are respectively supplied via outputs 11 to an image computer 17. The image computer 17 reconstructs an image from the measured data acquired in this way. The administration of the measured data, the image data and the control programs ensues via the system computer 20. On the basis of a prescription with control programs, the sequence controller 18 controls the generation of the respectively desired pulse sequences and the corresponding sampling of k-space. In particular, the sequence controller 18 controls the temporally correct switching of the gradients, the emission of the radiofrequency pulses with defined phase and amplitude as well as the reception of the nuclear magnetic resonance signals. The time basis for the RF 22 and the sequence controller 18 is made available by a synthesizer 19. The selection of corresponding control programs for generating a magnetic resonance image ensues via a terminal (console) 21 which has a keyboard as well as one or more picture screens.

With the described MRI-apparatus the most different MR-spectroscopy sequences can be generated and MR-spectroscopic localization methods can be realized for clinical applications. The described MRI-apparatus according to the present invention shall be able to generate pulse sequences, in which the RF pulses of different frequencies do not overlap each other temporally.

This particularly concerns NMR-experiments, which use a polarization transfer for signal enhancement.

Such methods tend to energetically prepare coupled spin systems of differently sensitive nuclear species (such as in CH, $CH_2$, NH, $NH_2$, . . . ) such, that the energy level population difference of nuclear spin species is increased and thereby increases emission and/or absorption, which leads to a significant signal enhancement of the nuclear species in the NMR-spectrum.

Figure 9A:
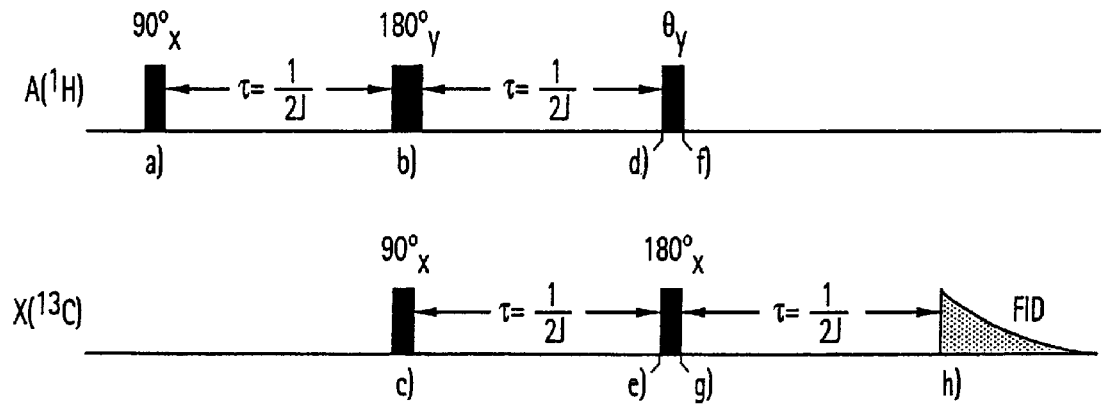
FIG. 9A shows the RF pulse sequence of the DEPT-method for an AX-system ($^1H$, $^{13}C$) according to the state of the art.
Figure 9B:
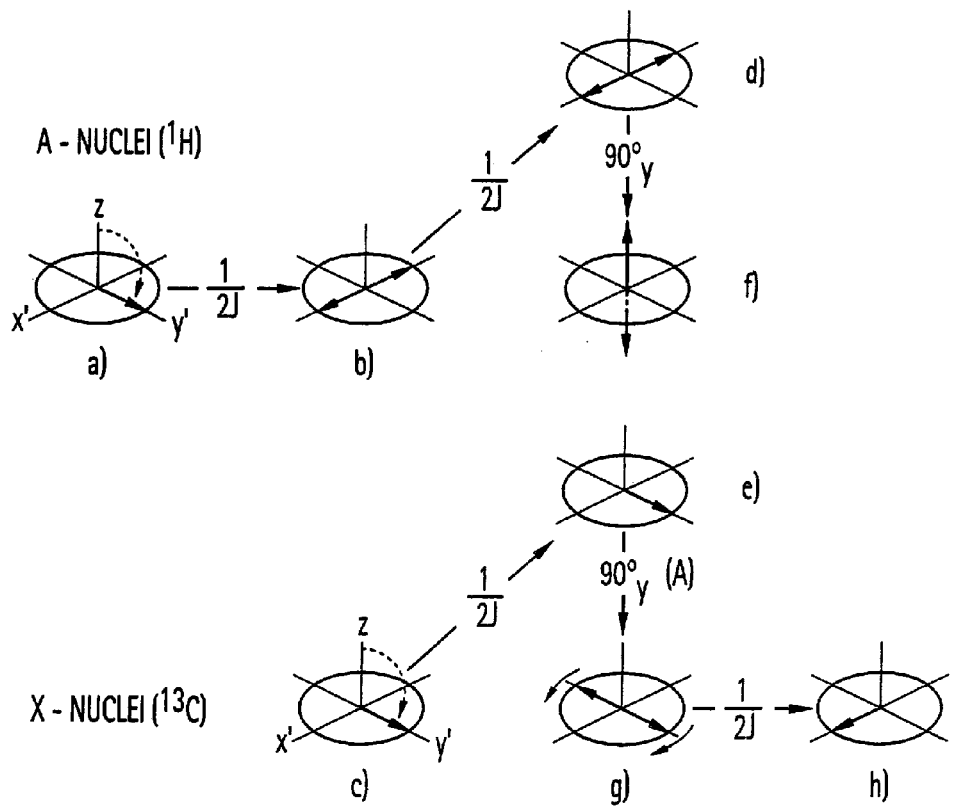
FIG. 9B shows the effect of the RF pulse sequence according to FIG. 9A on the A- and X-magnetization in a vector diagram (vector diagram of protons and carbons).
Figure 10A:
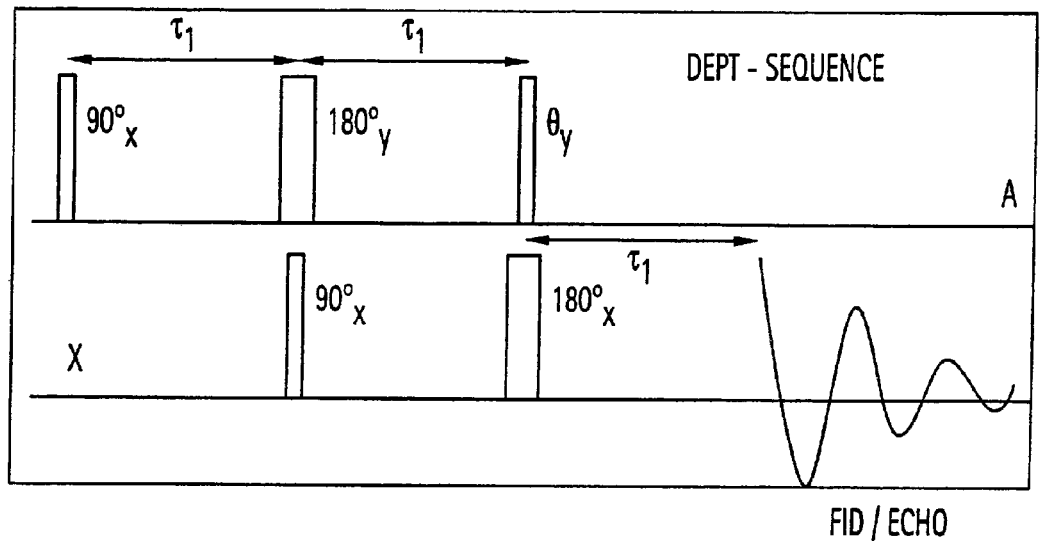
FIG. 10A shows the RF pulse sequence of the DEPT-method for an AX-system according to the state of the art.

An important pulse sequence in MR-spectroscopy which relies on the cross-polarization phenomenon respectively polarization-transfer for achieving sensitivity enhancement is known as "Distortionless Enhancement by Polarization Transfer" (DEPT). In the following the effect of the DEPT pulse sequence on a AX-system respectively on a CH-system is considered. The pulse sequence employed on the $^1H$ and $^{13}C$ nuclei and the effects on the corresponding magnetization vectors according to the state of the art are shown in FIGS. 9A, 9B and 10A. The modified pulse sequence according to the present invention as employed on the A ($^1H$) and X ($^{13}C$) nuclei and the effects on the corresponding magnetization vectors will be explained later by means of FIG. 10B.

It is noted that in the vector diagram the respective magnetization is illustrated in rotating frames. After an equilibrium delay T1 (not illustrated), which allows a Boltzmann equilibrium of the protons to be reached, a $90_x°$ pulse is applied to the A (e.g. $^1H$) nuclei (note that a) to h) in the pulse sequence of FIG. 9A correlate with a) to h), in the vector diagrams of FIG. 9B giving the corresponding effects on the magnetization vectors of the $^1H$ and $^{13}C$ nuclei) which causes the magnetization of the protons to be oriented along the y-axis (a) in FIG. 9B). In contrast to other sequences (e.g. INEPT, SINEPT), a time delay of $\tau=1/2J$ is now inserted during which the transverse magnetization of the $^1H$ nucleus is modulated through coupling with the $^{13}C$ nucleus. At the end of the $\tau=1/2J$ time period, the two doublet vectors of the $^1H$ nuclei are found to have a phase difference of 180°, and they lie along the x'-axis (b) in FIG. 9A). A $180_y°$ pulse is now applied to the protons in order to refocus any inhomogeneities. Simultaneously a $90_x°$ pulse is applied to the $^{13}C$ nuclei which creates transverse magnetization of these nuclei along the y-axis (c) in FIG. 9B).

Since there is no magnetization of the $^1H$ or $^{13}C$ nuclei along the z-axis, the two are now decoupled, and during the following $\tau=1/2J$ delay period, the vectors of both nuclei remain static in the rotating frames (see d) and e) in FIG. 9B). A proton pulse θ (the length of which is adjusted depending on the number of attached protons and the spectrum desired to be recorded) is then applied which serves to polarize the $^1H$ magnetization. The population transfer occurs at this stage, since the polarization of protons caused by the proton pulse θ also effects the $^{13}C$ nuclei due to $^{13}C$-$^1H$ coupling. An intensification of the $^{13}C$ magnetization vectors therefore takes place. In FIGS. 9A, 9B the length of this pulse has been kept at 90° which results in the $^1H$ magnetization coming to lie along the z-axis (f) in FIG. 9B). At the same time this proton pulse also causes a polarization of the $^{13}C$ nuclei (g) in FIG. 9B). Since z-magnetization now exists in the $^1H$ nucleus, spin-spin-coupling can take place with the $^{13}C$ nucleus, resulting in a refocusing of the $^{13}C$ magnetization vectors during the last $1/(2J)$ period (h) in FIG. 9B). The $^{13}C$ magnetization can now be detected at $t=3\tau$ either as doublet or, if $^1H$ decoupling is simultaneously applied, as a singlet.

Figure 11:
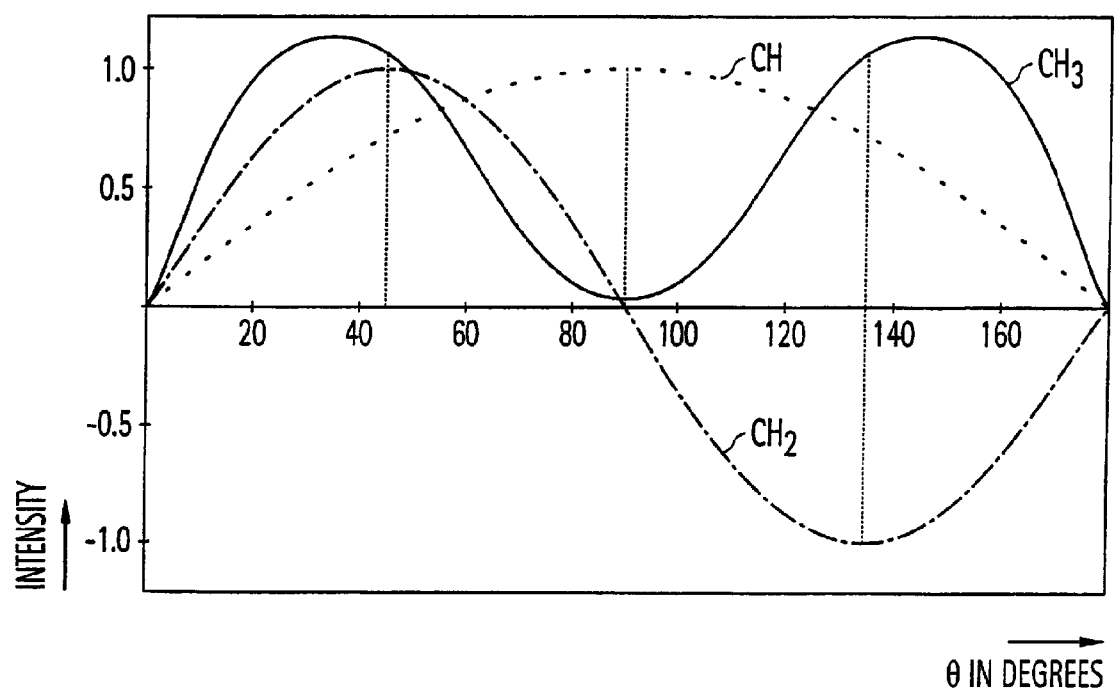
FIG. 11 shows the signal enhancements for $^{13}C$ doublets, triplets and quartets as a function of the DEPT-pulse-flip-angle θ.

The signal enhancements as a function of the variable θ pulse for $CH_3$, $CH_2$ and CH carbons are shown in FIG. 11. An experiment with θ=90° results in a spectrum containing peaks for CH carbon atoms only. A 135° θpulse, on the other hand, affords a spectrum with $CH_3$ and CH carbon atoms bearing positive amplitudes and $CH_2$ carbon atoms with negative amplitudes. If the value of the θ pulse is kept at 45°, then $CH_3$, $CH_2$ and CH carbons all appear with positive amplitudes. In this way variations in the value of θ can be used for spectral editing.

In contrast to other methods (INEPT, SINEPT) DEPT spectra afford multiplets, which have the same appearance as in the normal spectrum. Moreover, the acquisition of spectra with other methods (INEPT, SINEPT) requires knowledge of J values for setting delays between pulses and variations in the settings would result in different enhancements in the for example decoupled INEPT spectra. DEPT spectra, on the other hand, depend on variation in the length of the θ pulse and are independent of the exact delay times $1/(2J)$ between the pulses so that an error of ±20% in J values would still afford good DEPT spectra.

Clinical MR scanners are in general not equipped with a second transmit RF channel making conventional polarization transfer techniques like Distortionless Enhanced Polarization Transfer (DEPT) impossible. According to the state of the art this problem is solved by adding a separate RF channel to the MR system that enables simultaneous transmission on the spins of two different nuclei (like $^{13}C$ and $^1H$). As such an additional RF channel is expensive and requires extensive effort to integrate into a clinical MR system, alternatives are required.

Figure 12:
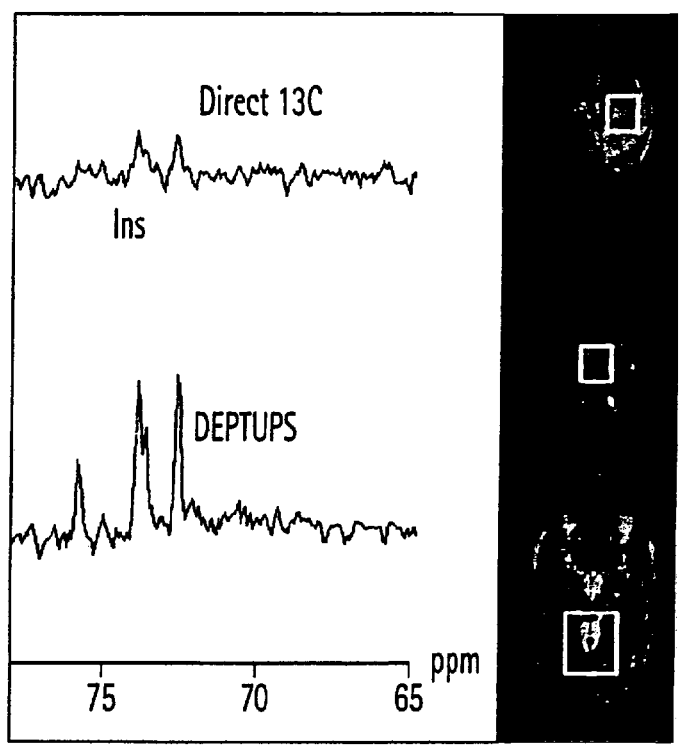
FIG. 12 shows the signal enhancements of localized DEPTUPS (Distorsionless Enhancement by Polarization Transfer Using Pulses Sequentially) for $^{13}C$ resonances in the spectra.

According to the present invention it is suggested to modify the conventional DEPT sequence in such way that the irradiated HF-pulses do not overlap in time, while maintaining a best possible symmetry in the A-domain as well as in the X-domain. This means that, in contrast to the conventionally DEPT sequence which is characterized by only one time delay $\tau_1$ with $\tau_1=1/2J$, new time delays must be introduced taking into consideration firstly the behavior of precession of the specific magnetization of the respective species of nuclei and secondly the maintenance of total symmetry in the domain of both species of nuclei. This new modified DEPT-sequence, characterized by using RF pulses on a single transmit channel, therefore called DEPTUPS (DEPT-Using-Pulses-Sequentially) enables the use of polarization transfer (PT) without the need of an expensive additional RF transmit channel. A comparison between direct-13C-NMR-spectroscopy and DEPTUPS is illustrated in FIG. 12.

The great advantage of DEPT over other PT-based techniques (INEPT, SINEPT, etc.) is thereby that different species with different chemical shifts and J-couplings, which is the case for clinically interesting metabolites, can be detected simultaneously.

Figure 10B:
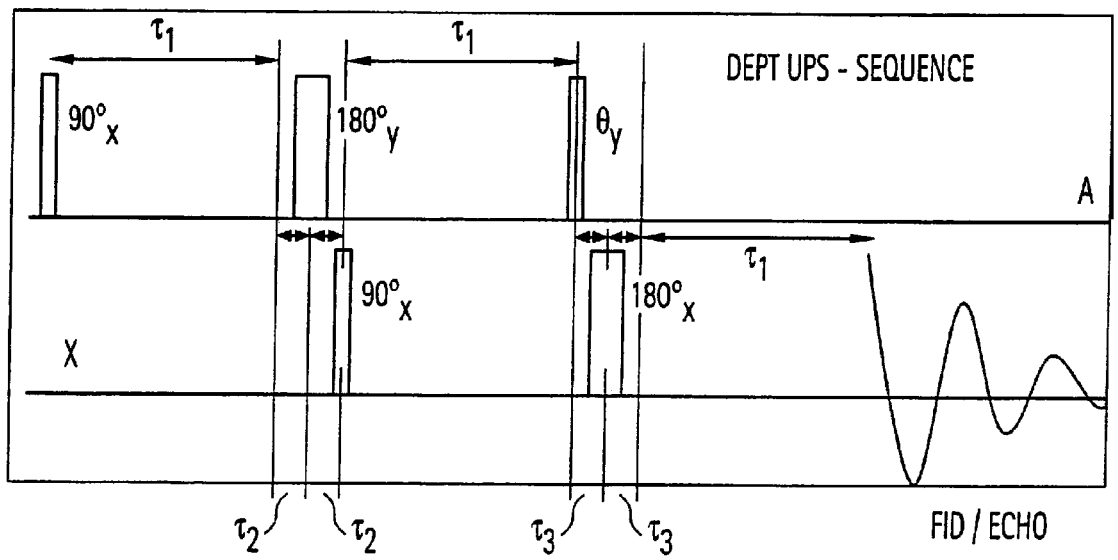
FIG. 10B shows a modification of the RF pulse sequence in the DEPT-method for an AX-system according to the present invention.

FIG. 10B shows such a modified DEPT sequence according to the present invention for a $^1$H and $^{13}$C nuclei system:

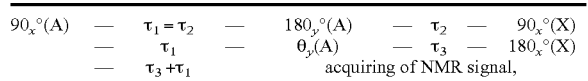

whereas the first and most important time interval is determined by the AX-respectively by the $^1$H-$^{13}$C-coupling:

$$\tau_1 = 1/2J$$

The $180_y°$-inversion-pulse for the A-spin-system, however, does not begin before the time delay $\tau_2$ which is determined by the sum of the half second A-selective $180_y°(A)$-HF-pulse and the half third X-selective $90_x°(X)$-HF-pulse and which also (together with $\tau_1$) determines the time distance between the very first two pulses $90_x°(A)$ and $180_y°(A)$. In order to achieve total symmetry in the A-domain without overlapping, the $\theta_y(A)$-pulse has to be irradiated $\tau_1$ after the center of the first pulse in the X-domain $90_x°(X)$. The fifth and also the last pulse in this sequence scheme is a X-selective $180_x°(X)$-RF-pulse irradiated after the time $\tau_3$ starting from the center of the fourth RF pulse $\theta_y(A)$. Since the fourth pulse $\theta_y(A)$ normally has not the same pulse width than the third pulse $90_x°(X)$, and also the fifth pulse $180_x°(X)$ has not the same pulse width than the second pulse $180_y°(A)$, the time delay $\tau_3$ is generally different from the time delay $\tau_2$. In order to achieve total symmetry in the X-domain without overlapping with the $180_x°(X)$-pulse to be irradiated $\tau_1+\tau_3$ after the center of the third pulse $90_x°(X)$ in the X-domain, the acquisition of the X-nuclear resonance signal (in form of a FID or an echo) has to be performed after a time $\tau_3+\tau_1$ starting from center of the fifth RF pulse $180_x°(X)$.

Figure 13:
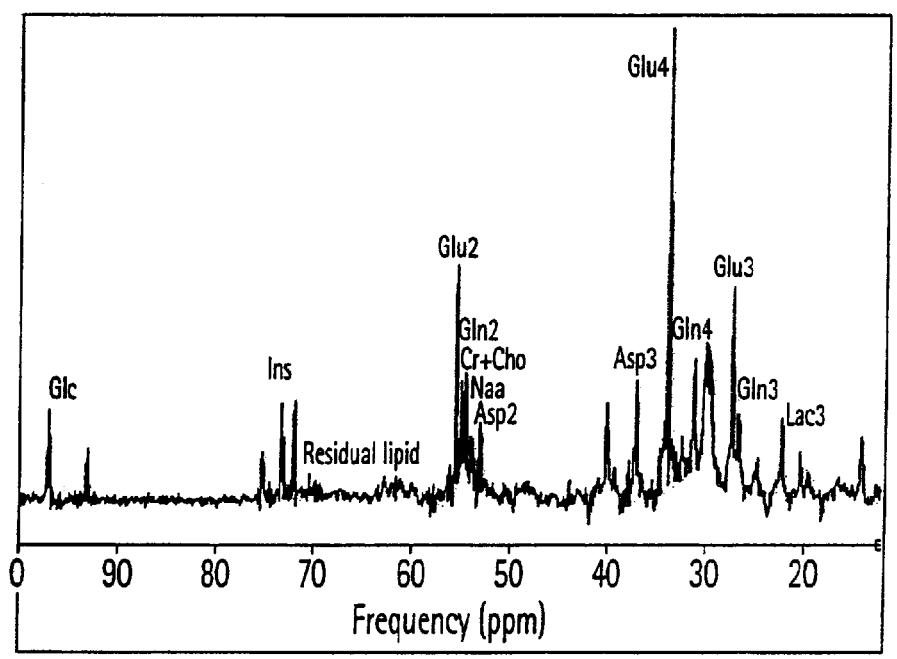
FIG. 13 shows a localized DEPTUPS spectrum with $^{13}C$ signals of different metabolites in human brain at 3T appearing upon $^{13}C$-1 glucose infusion. Frequency selective 1H RF pulses were used combined with $B_0$ gradients for localization.

Owing to this high symmetry of the sequence according to the present invention, a polarization transfer effect is realized not only to one nucleus in one type of molecule but to many nuclei integrated in different kinds of molecules and are therefore exhibiting resonances over a wide spectral range, because of the wide range of chemical shift, as can be seen in FIG. 13 by means of a $^{13}$C-MR-spectrum of the human brain at 3T obtained during 50% $^{13}$C-1 labelled glucose infusion.

The reason for the occurrence of resonances over a wide range of the DEPT/DEPTUPS spectrum is: the first 90°-pulse excites all nuclei of the corresponding nuclear species. Depending on the chemical shift the spins of nuclei in different kinds of molecules dephase with a different speed. When giving a 180'-pulse, a overall rephasing takes place, so that after the time of dephasing and rephasing all spins with different chemical shift are exactly in phase at the same duration of time starting at dephasing. If then another RF pulse is exciting the nuclei, it is certain that the spins of nuclei of all molecules have the same phase and experience the full polarization transfer effect.

Taken together the new DEPTUPS-sequence shows multiple advantages. The different potential applications in (N)MR-Spectroscopy are:

Monitoring $^{13}$C signals of compounds, which are otherwise difficult to resolve by conventional $^1$H-NMR-spectrocopy, due to the strong signal overlap;

Monitoring signals of carbons labelled with $^{13}$C to uncover (abnormal) metabolic conversions. This is for instance of interest in brain diseases. New strategies are now being explored in order to make this clinically feasible. There have recently also been proposals for a new head coil for improved $^{13}$C MRS of the human brain. With the proposed innovation of a single RF channel, a DEPT sequence becomes more realistic and cost-effective in the clinical application;

An emerging new field is MRI with hyperpolarisation of $^{13}$C (or other (N)MR sensitive nuclei) in compounds to boost sensitivity. Currently this is mostly performed with carbons, which are not attached to protons in order to take advantage of the long T1 values of these spins. However, molecular conversions may cause these carbons to become attached to protons and then polarization transfer may further enhance their signal. Moreover, due to the presence of long-range couplings from protons to (carbonyl) carbons (J-coupling arise from 2-15 Hz), polarisation transfer may also be effectuated for these carbons;

The present invention is generally applicable to polarization transfer of any nucleus to another nucleus. In this way high population spin differences of any nuclei created by any method can be advantageously used to enhance the sensitivity of any other nuclei. The only restriction is that the increase in sensitivity is not counterbalanced by T2 loss, e.g. $1/J<(5\times T2)$. For instance, polarization transfer of $^1$H to $^{31}$P nuclei was recently demonstrated in vivo by a so called INEPT approach (Mancini et al. MRM 54:1065-1071; 2005). Several of the disadvantages mentioned in this paper for the INEPT approach (SAR, bandwidth) can be circumvented by the proposed innovation using the DEPT sequence. This is of interest, as the polarization transfer enables an improved visualization of phosphorylated membrane compounds (e.g. phosphocholine) which are central in tumor and cell growth (in contrast to $^1$H-NMR-Spectroscopy which only visualizes bulk choline compounds).

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for detection and spectral editing in magnetic resonance spectroscopy comprising the steps of:

sequentially irradiating a modified DEPT sequence comprising a plurality of RF pulses into a subject at respective, defined time intervals relative to each other, so that at no time are different phase coherent RF pulses irradiated concurrently overlapping, said subject containing a first nuclear spin system A exhibiting a high spin population difference between at least two energy levels of said first nuclear spin system, and a second nuclear spin system X having a low spin population difference between at least two energy levels of said second nuclear spin system;

in said modified DEPT sequence, irradiating a first A-selective $90_x°$ RF pulse that excites the atomic nuclei with said high spin population difference, irradiating the center of a second A-selective $180_x°$ RF pulse after a time $\tau_1+\tau_2$ starting from the center of said first A-selective RF pulse, irradiating the center of a third X-selective $90_x°$ RF pulse after a time $\tau_2$ starting from the center of said first A-selective RF pulse, irradiating the center of a fourth A-selective $\theta_y$ RF pulse after a time $\tau_1$ starting from the center of said third X-selective RF pulse, irradiating the center of a fifth X-selective $180_x°$ RF pulse after a time $\tau_3$ starting from the center of said fourth A-selective RF pulse;

acquiring a magnetic resonance signal from atomic nuclei in said second nuclear spin system by detecting an FID signal therefrom after a time $\tau_3+\tau_1$ starting from the center of said fifth X-selective RF pulse;

said sequential succession of said RF pulses producing a polarization transfer between atomic nuclei of the respective first and second spin systems by transferring said high spin population different of said first nuclear spin system to said energy levels of said second nuclear spin system; and said sequence of said RF pulses in respective domains of said atomic nuclei of said first and second nuclear spin systems being completely symmetric.

2. A method as claimed in claim 1 comprising employing $\tau_1=1/2J$, wherein J is a coupling constant between the atomic nuclei of the respective first and second nuclear spin systems.

3. A method as claimed in claim 2 comprising employing long range coupling for achieving said polarization transfer.

4. A method as claimed in claim 1 comprising employing a value for $\tau_2$ that is at least a sum of half of said second A-selective RF pulse and half of said third X-selective RF pulse.

5. A method as claimed in claim 1 comprising employing a value for $\tau_3$ that is at least a sum of half of said fourth A-selective RF pulse and half of said fifth X-selective RF pulse.

6. A method as claimed in claim 1 comprising selecting $\tau_2$ and $\tau_3$ independently to influence a spectral shape of said first and second nuclear spin systems.

7. A method as claimed in claim 1 wherein said first and second nuclear spin system exhibit coupling for an X-multiplet of an $A_nX$ group, wherein n=1, 2, 3.

8. method as claimed in claim 1 wherein said first nuclear spin system consists of one type of atomic nuclei selected from the group consisting of $^1H$, $^{13}C$, $^{15}N$ and $^{19}F$ nuclei.

9. A method as claimed in claim 1 wherein said second nuclear spin system consists of one type of atomic nuclei selected from the group consisting of $^{13}C$, $^{31}P$, $^{15}N$, $^{19}F$ and $^1H$ nuclei.

10. A magnetic resonance spectroscopy apparatus for detection and spectral editing in magnetic resonance spectroscopy comprising:

a magnetic resonance scanner configured to interact with a subject to acquire MR spectroscopic data therefrom, said subject containing a first nuclear spin system A exhibiting a high spin population difference between at least two energy levels of said first nuclear spin system, and a second nuclear spin system X having a low spin population difference between at least two energy levels of said second nuclear spin system, said scanner having an RF transmit coil; and a control unit that operates said RF transmit coil to sequentially irradiate a modified DEPT sequence comprising a plurality of RF pulses into the subject at respective, defined time intervals relative to each other, so that at no time are different phase coherent RF pulses are irradiated concurrently overlapping, by, in said modified DEPT sequence, in said modified DEPT sequence, irradiating a first A-selective $90_x°$ RF pulse that excites the atomic nuclei with said high spin population difference, irradiating the center of a second A-selective $180_x°$ RF pulse after a time $\tau_1+\tau_2$ starting from the center of said first A-selective RF pulse, irradiating the center of a third X-selective $90_x°$ RF pulse after a time $\tau_2$ the starting from the center of said first A-selective RF pulse, irradiating the center of a fourth A-selective $\theta_y$ RF pulse after a time $\tau_1$ starting from the center of said third X-selective RF pulse, irradiating the center of a fifth X-selective $180_x°$ RF pulse after a time $\tau_3$ starting from the center of said fourth A-selective RF pulse, acquiring a magnetic resonance signal from atomic nuclei in said second nuclear spin system by detecting an FID signal therefrom after a time $\tau_3+\tau_1$ starting from the center of said fifth X-selective RF pulse, said sequential succession of said RF pulses producing a polarization transfer between atomic nuclei of the respective first and second spin systems by transferring said high spin population different of said first nuclear spin system to said energy levels of said second nuclear spin system, and said sequence of said RF pulses in respective domains of said atomic nuclei of said first and second nuclear spin systems being completely symmetric.

11. An apparatus as claimed in claim 10 comprising a single broadband phase coherent transmit channel for said polarization transfer.

12. An apparatus as claimed in claim 10 comprising a single broadband phase-continuous transmit channel allowing selection of said time intervals to obtain correct phases for all of said RF pulses for said polarization transfer.

* * * * *